United States Patent [19]

Koga

[11] Patent Number: 5,161,000
[45] Date of Patent: Nov. 3, 1992

[54] HIGH-FREQUENCY THICK-FILM SEMICONDUCTOR CIRCUIT

[75] Inventor: Masanori Koga, Itami, Japan

[73] Assignee: Mitsubishi Denki Kabushiki Kaisha, Tokyo, Japan

[21] Appl. No.: 643,099

[22] Filed: Jan. 22, 1991

Related U.S. Application Data

[63] Continuation of Ser. No. 476,790, Feb. 8, 1990, abandoned.

[30] Foreign Application Priority Data

Dec. 5, 1989 [JP] Japan .................... 1-314440

[51] Int. Cl.⁵ ............ H01L 23/02; H01L 23/12; H01L 29/40; H01L 23/48
[52] U.S. Cl. ................ 257/712; 257/728; 257/924
[58] Field of Search ............ 357/43, 4, 36, 72, 74, 357/75, 80, 81, 65, 68

[56] References Cited

U.S. PATENT DOCUMENTS 4,161,740  7/1979  Frey ..................... 357/36
4,400,711  8/1983  Avery ................... 357/43

Primary Examiner—Andrew J. James
Assistant Examiner—Carl Whitehead, Jr.
Attorney, Agent, or Firm—Leydig, Voit & Mayer

[57] ABSTRACT

A high-frequency semiconductor device includes a semiconductor element disposed on a top surface of a protrusion of a thin heat-radiating plate. The high-frequency semiconductor device also has a first conductive grounding bridge on which a MOS capacitive element is disposed. Since the heat-radiating plate can be extended to lie beneath the conductive grounding bridge, the heat resistance of the semiconductor element and of the heat-radiating plate can be reduced, and the size of the insulating substrate can be reduced.

3 Claims, 2 Drawing Sheets

HIGH-FREQUENCY THICK-FILM SEMICONDUCTOR CIRCUIT

This application is a continuation of Application Ser. No. 07/476,790, filed Feb. 8, 1990 now abandoned.

BACKGROUND OF THE INVENTION

1. Field of the Invention:

The present invention relates to a high-frequency semiconductor device and in particular, to a thick film hybrid integrated circuit for power amplification in a radio communication apparatus or the like which employs a high-frequency transistor.

2. Description of the Related Art:

Hybrid integrated circuit apparatus for power amplifying modules in a radio communication apparatus have been proposed recently. The overall size of such hybrid integrated circuit apparatus has been reduced. The semiconductor device of this type will be described below with reference to the accompanying drawings.

FIG. 1A is a schematic plan view of a semiconductor element portion of a conventional, high-frequency semiconductor device, e.g., a thick-film hybrid integrated circuit. FIG. 1B is a sectional view taken along the line B—B of FIG. 1A, FIG. 1C is a sectional view taken along the line C—C of FIG. 1A, and FIG. 1D is a sectional view taken along the line D—D of FIG. 1A. In these figures, a conductive film 2 for input, a conductive film 3 for output, and a conductive film 4 for grounding are formed by metallization of an insulating substrate 1 which is formed of a ceramic material, such as alumina. The input film 2 is connected to a semiconductor element 7, e.g., npn type transistor, by a wire 5a through a bonding pad 6. The conductive grounding film 4 is connected to the semiconductor element 7 by a wire 5b through a bonding pad 8.

The semiconductor element 7 emits a large amount of heat because it is used for high-power amplification. Thus, a heat radiating plate 9 is disposed on the conductive output film 3 to improve the radiation of heat from the semiconductor element 7. The semiconductor element 7 is fixed on the heat radiating plate 9 by brazing or the like. A MOS (metal oxide semiconductor) capacitive element 10 is disposed on the conductive grounding film 4 owing to an extremely low impedance of the high-frequency transistor. On the MOS capacitive element 10 are formed a pad 11a for the MOS capacitive element 10 and a pad 11b whose bottom surface is grounded.

The bonding pad 8 for grounding and the pad 11b are connected by the wire 5b. If the wires 5a and 5b are long, high performance cannot be obtained in the high frequency area due to the influence of a reactance. Hence, in order to reduce the reactance, the wires 5a and 5b are connected in parallel, and a grounded conductive bridge 12 including bridging portion 12b and legs 12c and 12d and for to which wire 5b is connected is provided. Also, a heat radiating plate 13 formed of, for example, copper for improving the radiation of heat from the semiconductor element 7 is disposed on the rear surface of the insulating substrate 1.

In the high-frequency semiconductor apparatus arranged in the above-described manner, since the wires 5a and 5b are shortened to achieve improvement in the high-frequency characteristics, the semiconductor element 7 is fixed to the heat-radiating plate 9 by means of die bonding or the like. It is known that heat is transmitted at an expanding angle of about 45 degrees. The heat-radiating plate 9 therefore radiates heat from the semiconductor element 7 only in one direction. Thus, in order to achieve a reduction in the heat resistance of the semiconductor element 7 and of the heat-radiating plate 13, the area at which the heat-radiating plate 9 is in contact with the insulating substrate 1 must be increased. However, an increase in the size of the heat-radiating plate 9 makes reduction of the size of the insulating substrate 1 difficult. Furthermore, it is desirable that the bonding pads for the wires 5a and 5b be formed in the same plane increase the strength of adhesion.

In the above-described high-frequency semiconductor device, the area at which the semiconductor element 7 is in contact with the insulating substrate 1 cannot be increased due to the presence of the MOS capacitive element 10. Therefore, the heat resistance of the semiconductor element 7 and of the heat-radiating plate 13 cannot be reduced, thereby making it impossible to reduce the size of the insulating substrate 1. Furthermore, the bonding pads for the pads 11a and 11b formed on the MOS capacitive element 10, the bonding pads 6 and 8 on the semiconductor element 7, and a bonding pad 12a for the conductive bridge 12 for grounding are at different heights, reducing the reliability of the wire bonding.

SUMMARY OF THE INVENTION

The present invention is directed to obviating the aforementioned problem and an object thereof is to provide a high-frequency semiconductor device in which the heat resistance of a semiconductor element and of a heat-radiating plate are reduced without increasing the lengths of the wires.

In order to achieve the above objects, according to the present invention, there is provided a high-frequency semiconductor device comprising an insulating substrate; a conductive input film disposed on a first surface of the insulating substrate; a conductive output film disposed on the first surface of the insulating substrate; at least two conductive grounding films disposed on the first surface of the insulating substrate; a conductive grounding bridge disposed the at least two conductive grounding films; a capacitive element disposed on the bridge; a heat-radiating plate disposed on the conductive output film, the heat-radiating plate having an end inserted into the bridge; and a semiconductor device disposed on the heat-radiating plate.

DESCRIPTION OF THE PREFERRED EMBODIMENTS

Figure 1A:
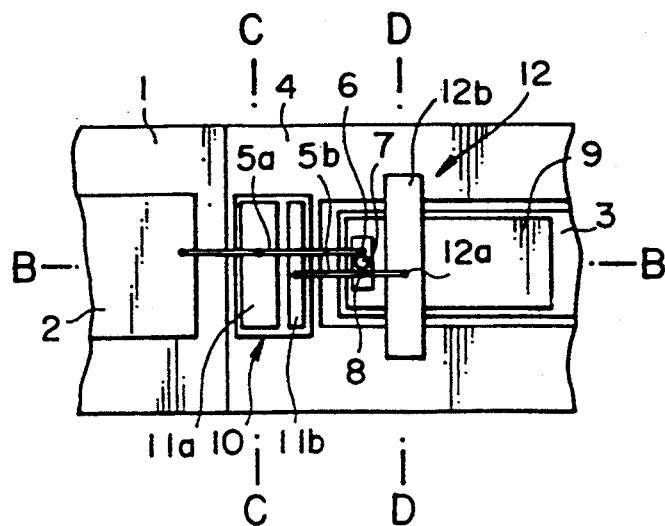
FIG. 1A is a schematic plan view of a conventional high-frequency semiconductor device.
Figure 1C:
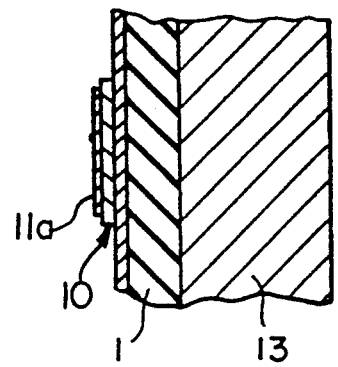
FIG. 1C is a section taken along the line C—C of FIG. 1A.
Figure 1B:
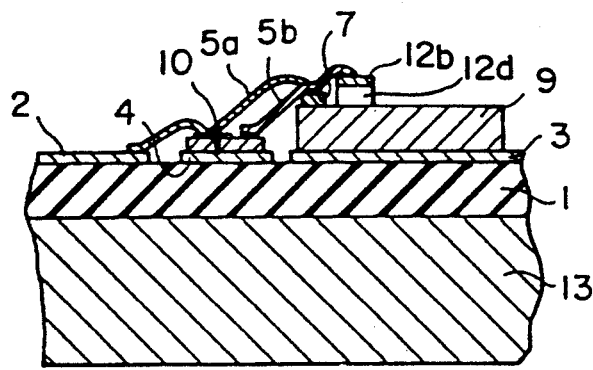
FIG. 1B is a section taken along the line B—B of FIG. 1A.
Figure 1D:
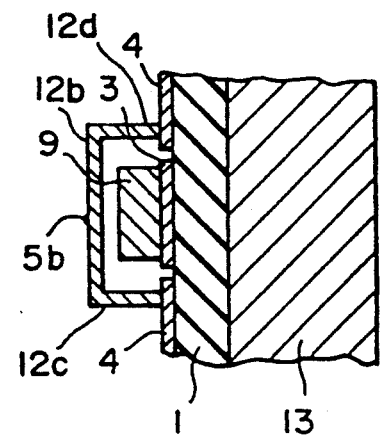
FIG. 1D is a section taken along the line D—D of FIG. 1A.
Figure 2A:
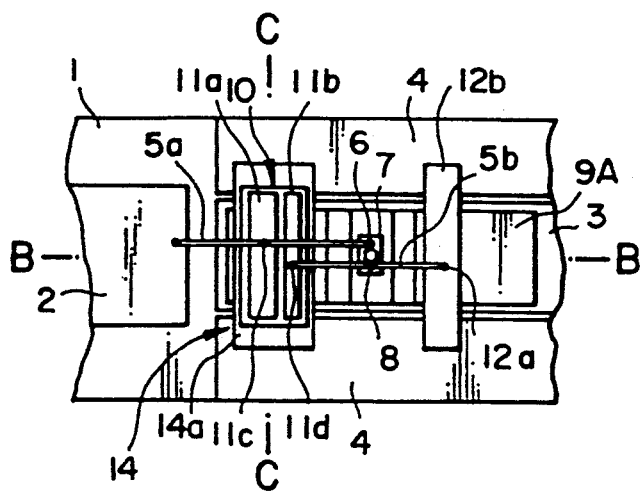
FIG. 2A is a schematic plan view of a high-frequency semiconductor device according to an embodiment of the present invention.
Figure 2C:
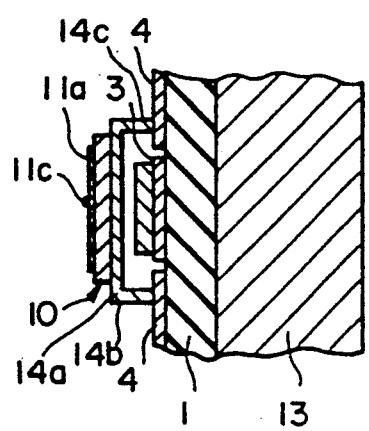
FIG. 2C is a section taken along the line C—C of FIG. 2A.
Figure 2B:
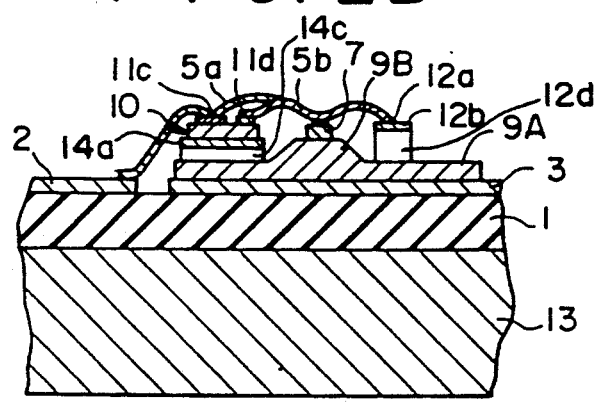
FIG. 2B is a section taken along the line B—B of FIG. 2A.

FIG. 2A is a schematic plan view of a semiconductor device portion of a high-frequency semiconductor device, according to a first embodiment of the present invention, e.g., a thick-film hybrid integrated circuit. FIG. 2B is a section taken along the line B—B of FIG. 2A, and FIG. 2C is a section taken along the line C—C of FIG. 2A. In these figures, reference numerals 1 to 13 denote the same parts as shown in FIGS. 1A, 1B, 1C and 1D, with the exception that a reference numeral 12 denotes a first conductive grounding bridge.

A heat-radiating plate 9A is thinner than the conventional one, and has a convex portion i.e., protrusion, 9B at its center. The semiconductor element 7 is fixed to this protrusion 9B by brazing or the like. A second conductive grounding bridge 14 having a bridging portion 14a and legs 14b and 14c is disposed on the conductive grounding film 4 covering the heat-radiating plate 9A, and the MOS capacitive element 10 is mounted on this second conductive grounding bridge 14 by brazing or the like.

In the high-frequency semiconductor device arranged in the above-described manner, the heat-radiating plate 9A extends below the second conductive grounding bridge 14. In consequence, heat resistance can be improved without increasing the area of the heat-radiating plate 9A with which the semiconductor element 7 is in contact. In other words, heat resistance of the semiconductor element 7 and of the heat-radiating plate 9A are reduced, so that the size of the insulating substrate 1 can be reduced. It is desirable that the convex portion 9B have a wide base which is expanded at an angle of 45 degrees or above considering heat radiation. The height of the bonding pads 6 and 8 for the semiconductor element 7 can be made equal to either the bonding pad 12a for the first conductive grounding bridge 12 or of the bonding pads 11c and 11d by selecting the height of the convex portion 9B. In this way, wire bonding can be performed in the same horizontal plane, reducing wire breakage and producing highly reliable wire bonding.

Figure 3:
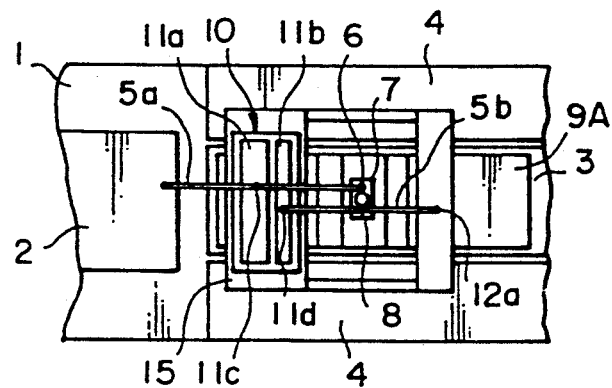
FIG. 3 is a schematic plan view of a high-frequency semiconductor device according to another embodiment of the present invention.

In the above-described embodiment, the first conductive grounding bridge 12 and the second conductive grounding bridge 14 are seperately formed on the conductive film 4. However, as shown in FIG. 3, the legs of these bridges may be connected to form an integrated bridge 15. In that case, since the integrated bridge 15 can be formed in a single process whereas the first and second conductive grounding bridges 12 and 14 are formed on the conductive grounding film 4 by separate processes, the manufacturing process can be simplified.

What is claimed is:

1. A high-frequency thick-film hybrid semiconductor circuit comprising:
   an insulating substrate having a first surface;
   a conductive input film disposed on the first surface of said insulating substrate;
   a conductive output film disposed on the first surface of said insulating substrate;
   at least two conductive grounding films disposed on the first surface of said insulating substrate with said conductive output film disposed therebetween;
   a first conductive grounding bridge including two legs, each leg being disposed on one of said at least two conductive grounding films, and a bridging portion joining the legs and spaced from the first surface;
   a capacitive element mounted on the bridging portion of said first grounding bridge and including a first bonding pad;
   a second conductive grounding bridge including two bases, each base being disposed on one of said at least two conductive grounding films, a bridging portion joining the bases and spaced from the first surface, and a second bonding pad on said bridging portion;
   a heat-radiating plate mounted on said conductive output film, said heat-radiating plate having a first end portion disposed between said conductive output film and said bridging portion of said first grounding bridge, a second end portion disposed between said conductive output film and said bridging portion of said second grounding bridge and a protrusion protruding away from said substrate and including a top surface disposed between said first and second grounding bridges; and
   a semiconductor element mounted on said heat-radiating plate on said top surface between said first and second grounding bridges and having a third bonding pad wherein said first, second, and third bonding pads are substantially coplanar.

2. A high-frequency thick-film hybrid semiconductor circuit according to claim 1 wherein said protrusion includes a base and surfaces joining the top surface and said base forming an angle of at least 45 degrees with the first surface.

3. A high-frequency thick-film hybrid semiconductor circuit according to claim 1 wherein said first and second conductive grounding bridges include connecting portions connecting said first and second grounding bridges to each other along said conductive grounding films.

* * * * *